United States Patent [19]

Watakabe

[11] 4,170,502

[45] Oct. 9, 1979

[54] METHOD OF MANUFACTURING A GATE TURN-OFF THYRISTOR

[75] Inventor: Yaichiro Watakabe, Itami, Japan

[73] Assignee: Mitsubishi Denki Kabushiki Kaisha, Tokyo, Japan

[21] Appl. No.: 922,890

[22] Filed: Jul. 7, 1978

[30] Foreign Application Priority Data

Aug. 18, 1977 [JP] Japan .................................. 52-99367

[51] Int. Cl.$^2$ ........................................ H01L 21/225
[52] U.S. Cl. ................................. 148/191; 148/33.5; 148/187; 29/571; 357/38
[58] Field of Search ...................... 148/191, 187, 33.5; 29/571; 357/38

[56] References Cited

U.S. PATENT DOCUMENTS

| | | | |
|---|---|---|---|
| 3,436,809 | 4/1969 | Peacock | 148/191 |
| 3,484,309 | 12/1969 | Gilbert | 148/335 |
| 3,909,321 | 9/1975 | Roberts | 357/38 X |

*Primary Examiner*—G. Ozaki
*Attorney, Agent, or Firm*—C. L. Menzemer

[57] ABSTRACT

This disclosure sets forth a method of manufacturing a gate turn-off (GTO) thyristor which includes the step of altering the lateral electrical resistance of one base region by out diffusion from selected portions of the base region.

6 Claims, 6 Drawing Figures

METHOD OF MANUFACTURING A GATE TURN-OFF THYRISTOR

BACKGROUND OF THE INVENTION

1. Field of the Invention

This invention is in the field of semiconductor devices and is directed particularly to thyristors, and especially to (GTO) thyristors.

2. Description of Prior Art

In general, thyristors are four layer, P-N-P-N structures considered to be comprised of a P-N-P and an N-P-N transistor with the two central regions being common to both transistors. The thyristor is held in the "on-state" by driving the two interior or base regions.

GTO thyristors are thyristors designed to go from the "on-state" to the "off-state" by withdrawing current from one of the base regions.

With reference to FIG. 1, there is shown a longitudinal cross-sectional schematical view of a conventional (GTO) thyristor.

A typical manufacturing process would comprise a P+ type emitter layer (10) being formed on a first main face of an N− silicon substrate which eventually constitutes a base layer (12) of the thyristor by diffusion. Then a P type base layer (14) being formed in a predetermined portion of a second main face of the N− type base layer (10) by diffusion. An N+ type emitter layer (16) being formed which extends from the surface of that P type base layer (14) into the interior thereof.

Subsequently, after an insulating film (18) used as a mask for forming the N+ type emitter layer (16) has been windowed, an anode electrode (20), gate electrodes (22) and a cathode electrode (24) are formed by conventional methods.

An important parameter for thyristors is turn-off gain ($G_{off}$). Turn-off gain indicates how much current ($I_G$) is required to be drawn from the base region to turn the principal current ($I_A$) off. In order to render electric power consumed by the gate circuit low, it is necessary to decrease the drawn ($I_G$) and increase the ($G_{off}$). Assuming that $\alpha_p$ and $\alpha_n$ designate respectively current amplification degrees of the PNP and NPN transistors, formed by regions 10-12-14 and regions 16-14-12 respectively which are the elements comprising the GTO thyristor, ($G_{off}$) is expressed by the equation:

$$G_{off} = I_A/I_G = \alpha_n/(\alpha_p + \alpha_n - 1).$$

More specifically, and as can be seen from the above equation, increasing the ($G_{off}$) decreases the $\alpha_n$ and $\alpha_p$ and causes $\alpha_n + \alpha_p$ to approximate 1. In prior art in order to decrease $\alpha_p$, gold doping has been used. Also the P type base layer (14) has been thickened and its impurity concentration made higher in order to make the $\alpha_n$ small but then an "on-state" voltage becomes high and forward voltage drop increases. Further a loss due to the "turn-off" increases. In order to make the "on-state" voltage low, the $\alpha_n$ is more or less increased. Namely, when the P type base layer (14) is thinned and its impurity concentration is lowered, the P type base layer (14) increases in lateral resistance resulting in the (GTO) thyristor being difficult to "turn off" and an increased switching loss is realized.

In order to prevent the lateral resistance of P− type base region (14) from increasing, or at least to minimize any increase in lateral resistance, there was developed a (GTO) thyristor of the type shown in FIG. 2. The same numbers have been used in FIG. 2 as in FIG. 1 to denote similar or like regions and electrodes.

In the (GTO) thyristor shown in FIG. 2 gate electrode (22) is digitized or striped on P type base layer (14) to prevent the lateral resistance of the P type base layer (14) from increasing. Thus the "turn-off" time is shortened.

However, in order to further reduce the "turn-off" time of the (GTO) thyristor, it is required to further lower the lateral resistance of region 14 by decreasing the width or spacing of the gate electrode 22. This has decreased the yield due to pattern defects in the photoengraving step.

SUMMARY OF THE INVENTION

The present invention provides a method of manufacturing a (GTO) thyristor with a low lateral resistance base region and without the attendant yield problems of prior art devices comprising forming a first region of a first-type of conductivity on a first major surface of a body of semiconductor material having a second type of conductivity, forming a second region of said first type of conductivity on a second major surface of said body of semiconductor material, said second region being doped to a higher level than said first region, said first and second major surfaces of said body of semiconductor material being substantially parallel to each other, forming a coating of a material on predetermined portions of said second region, said coating being comprised of a material having a lower oxidation rate than said semiconductor material and being impervious to the diffusion of atoms of the doping material used to form said second region, heating said body of semiconductor material to form an oxide coating on that portion of said second region not having a coating of said material thereon and to out diffuse doping material from the portions of said second region not having the coating of said material thereon, forming a third region in a predetermined portion of said second region, said third region having said second type of semiconductivity and affixing metal electrodes to said first region, second region and third region.

DESCRIPTION OF THE DRAWINGS

For a better understanding of the nature and teachings of the present invention, reference should be made to the following detailed description and drawing in which.

DESCRIPTION OF PREFERRED EMBODIMENT

Figure 1:
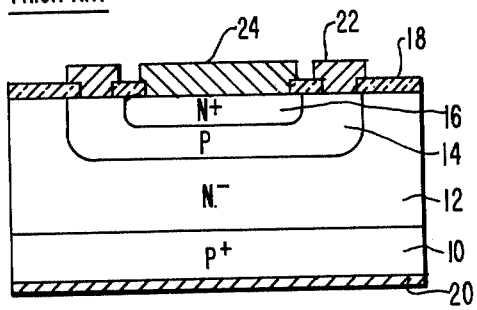
FIGS. 1 and 2 are longitudinal cross-sectional views of prior art (GTO) thyristors.
Figure 2:
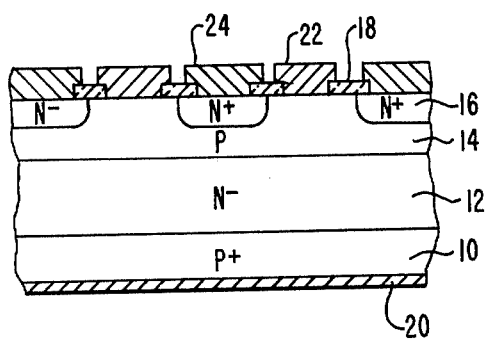
Figure 3:
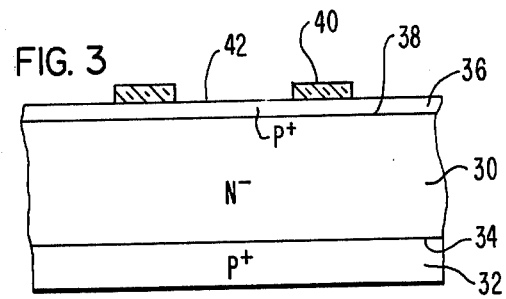
FIGS. 3, 4 and 5 are longitudinal cross-sectional views showing various process stages of the present invention.

With reference to FIG. 3, there is shown a body of semiconductor material 30, preferably silicon, having a resistivity typically of from 20 to 200 ohm-cm and typically a thickness of from 100 to 500µ. For purposes of describing the invention the body 30 will be considered to have an N− type conductivity. After processing in accordance with the teachings of this invention, the portion of the body that does not undergo a conductivity change will constitute a base region of a (GTO) thyristor.

A P+ conductivity type layer or region 32, which will constitute an anode emitting region of the (GTO) thyristor at the conclusion of the processing is formed a major surface 34 of the N− conductivity type body 30 according to conventional diffusion techniques.

Typically region 32 will have a thickness of from 40 to 100μ and be doped to a surface density of from $10^{20}$ to $10^{21}$ atoms per cc.

A second P+ conductivity type layer or region 36 is formed on major surface 38 of the N conductivity type body 30. Boron is particularly suited as a dopant for this step.

Region 36 is formed using boron or gallium according to conventional diffusion or ion implantation techniques.

Typical region 36 will have a thickness of 45 to 80μ and a resistivity of $10^{20}$ to $10^{21}$ atoms per cc.

Major surfaces 32 and 38 of body 30 are essentially flat and parallel.

A coating 40, for use as a mask is formed on predetermined portions of surface 42 of region 36.

The coating 40 is comprised of a material that has a lower oxidation rate in a heated oxygen ambient than silicon or the semiconductor material comprising the body 30.

In addition, for reasons that will become evident later, the coating 40 should be impervious to the diffusion of atoms of the doping material employed to form region 36.

A suitable material for the coating 40 is silicon nitride ($Si_3N_4$) or the coating 40 may consist of a first layer of silicon dioxide $SiO_2$ and a second layer of silicon nitride over said layer of $SiO_2$.

Typically coating 40 should have a thickness of about 5000 Å.

Figure 4:
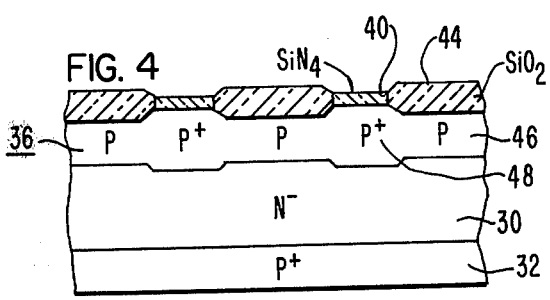

Then, as shown in FIG. 4, a selective oxidation is effected in an atmosphere of heated oxygen to form an $SiO_2$ layer 44 on that portion of surface 42 not already covered by coating 40.

During the formation of the silicon oxide layer 44 two events occur that alter the resistivity of that portion of region 36 over which the silicon oxide layer is being formed. Due to the heating needed to form the silicon oxide layer 44 doping atoms, boron atoms, out diffuse from the area and too, some of the silicon on which the oxide layer is being formed is converted, along with the boron doping atoms therein, to silicon oxide. The result is that the doping concentration in portion 46 of region 36, over which the silicon oxide layer 44 is formed is reduced.

Simultaneously, and as a result of the heating step to form the silicon oxide layer 44, the doping atoms in portion 48 of region 36 are driven deeper into region 30. No out diffusion occurs in portion 48 since the $Si_3N_4$ is impervious to the boron atoms. If the thermal oxidation to form layer 44, is effected in an atmosphere of wet oxygen then the difference in doping concentration portions 46 and 48 is particularly conspicuous. For example, when the boron is deposited so as to make a sheet resistance about 30Ω/□ and then the oxidation is effected in wet oxygen at a temperature of 1,100° C. for one hour, the portion 46 not including the $Si_3N_4$ layer has a sheet resistance increased by two orders of magnitude or more; several thousands Ω/□. In this way, the P type base portion 46 and the P+ type base portion 48 are formed at one time.

If it is required to further deepen the depth of the P type base layer 36 consisting of P type base portion (46) and P+ type base portion (48) in accordance with a specification for a particular (GTO) thyristor the heating step may be continued to effect the drive-in.

Figure 5:
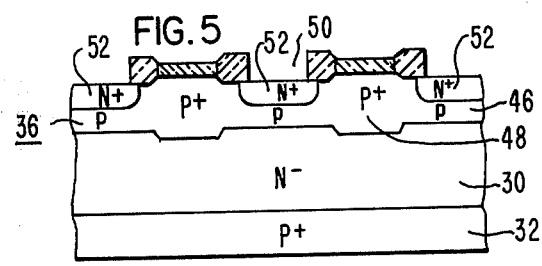

Subsequently, as shown in FIG. 5, the $SiO_2$ film (44) is window denoted as (50) with respect to the P type base portion (46) and an N type impurity such as for example phosphorus is introduced into the P type base portion (46) either by using a conventional diffusion technique or through ion implantation or the like to form an N+ conductivity emitter region 52. Typically, the emitter region is 15 to 25μ thick and has a surface doping concentration of about $10^{21}$ atoms per cc.

Figure 6:
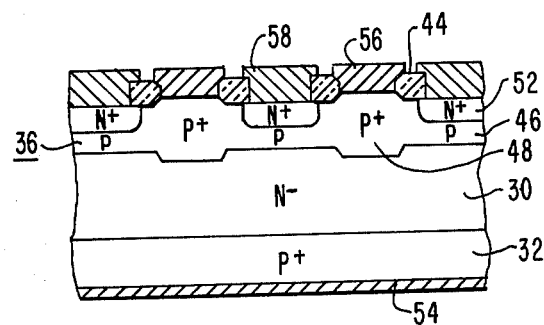
FIG. 6 is a longitudinal cross-sectional view of a (GTO) thyristor made in accordance with the teachings of this invention.

With reference to FIG. 6, the $Si_3N_4$ layer 40 over portion 48 of region 36 is removed as for example by etching with hot phosphoric acid or a gas plasma.

Then an anode electrode 54, a gate electrode 56 and a cathode electrode 58 are affixed to regions 32, portion 48 of region 36 and region 52, respectively, by known technology.

The device, a (GTO) thyristor shown in FIG. 6 has the following physical and electrical parameters:

Region 32, an anode emitter region is from 40 to 100μ thick and is doped to a surface concentration or density of $10^{20}$ to $10^{21}$ atoms per cc;

Region 30, an anode base region is from 100 to 500μ thick and is doped to a resistivity of from 20 to 200 ohm-cm;

Region 52, a cathode emitter region is from 15 to 25μ thick and doped to a surface concentration or density of about $10^{21}$ atoms per cc;

Region 36, a cathode base region has two portions, portion 46 and portion 48; portion 46 is from 20 to 50μ thick and has a sheet resistivity under the cathode region 52 of from 1000 to 10,000 ohms per square; portion 48 is from 45 to 80μ thick and has a resistivity of from 20 to 200 ohms per square;

Layer 40, preferably $Si_3N_4$ has a thickness of about 5000 Å;

Layer 44, $SiO_2$, has a thickness of about 13,000 Å;

Electrodes 56 and 58 are about 6000 Å thick,

In the (GTO) thyristor manufactured as above described, the P type base portion 46 of region 36 adjacent to the cathode 52 is maintained at a low impurity concentration and therefore "on-state" voltage can be low. An increase in lateral resistance of the P type base portion 46 of region 36 can be suppressed by the presence of the P+ type base portion 48 of region 36. Thus the (GTO) thyristor can readily be "turned off." Accordingly, it is not required to form the gate structure in a fine, closely spaced pattern with the attendant yield problems.

What is claimed is:

1. A method of manufacturing a gate turn-off thyristor comprising forming a first region of a first-type of conductivity on a first major surface of a body of semiconductor material having a second type of conductivity by introducing doping means through said first surface, forming a second region of said first type of conductivity on a second major surface of said body of semiconductor material by introducing doping material through said second surface, said second region being doped to a higher level than said first region, said first and second major surfaces of said body of semiconductor material being substantially parallel to each other, forming a coating of a material on only predetermined portions of said second region, said coating being comprised of a material having a lower oxidation rate than said semiconductor material and being impervious to the diffusion of atoms of the doping material used to form said second region, heating said body of semiconductor material to form an oxide coating on that portion of said second region not having a coating of said material thereon and to out diffuse doping material from the portions of said second region not having the coating of said material thereon, forming a third region in a predetermined portion of said second region, said third region having said second type of semiconductivity and affixing metal electrodes to said first region, second region and third region.

2. The method of claim 1 in which said coating formed on predetermined portions of said second region is $Si_3N_4$.

3. The method of claim 1 in which said coating formed on predetermined portions of said second region consists of a first layer of $SiO_2$ and a second layer of $Si_3N_4$ over said layer of $SiO_2$.

4. The method of claim 1 in which said first and said second regions are of a P+ type conductivity and said body of semiconductor material is of N type conductivity and said third region is of N+ type conductivity.

5. The method of claim 4 in which at least the second region is formed by doping with boron and the formation of said oxide coating is effected by heating in wet oxygen at 1,100° C. for one hour.

6. A method of manufacturing a gate turn-off thyristor comprising forming a first P− type conductivity emitter region on a first major surface of a body of N− type conductivity semiconductor material, forming a second region of P+ type conductivity on a second major surface of said body of N− type conductivity semiconductor material, said first and second major surfaces of said body of semiconductor material being substantially parallel to each other, forming a coating of $Si_3N_4$ on predetermined portions of said second region, heating said body of semiconductor to form an oxide coating of that portion of said second region of P+ type conductivity not having the coating of $Si_3N_4$ thereon, and to out diffuse a portion of the doping material from the portions of said second region of P+ type conductivity not having the coating of $Si_3N_4$ thereon, forming a N+ type conductivity emitter region in a predetermined portion of said second region, and affixing metal electrical contacts to said first, second and third regions.

* * * * *